(12) United States Patent
Anderson et al.

(10) Patent No.: US 7,659,579 B2
(45) Date of Patent: Feb. 9, 2010

(54) FETS WITH SELF-ALIGNED BODIES AND BACKGATE HOLES

(75) Inventors: Brent A. Anderson, Jericho, VT (US); Andres Bryant, Burlington, VT (US); Edward J. Nowak, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 379 days.

(21) Appl. No.: 11/539,288

(22) Filed: Oct. 6, 2006

(65) Prior Publication Data

US 2008/0185644 A1 Aug. 7, 2008

(51) Int. Cl.
*H01L 29/78* (2006.01)
(52) U.S. Cl. ............... 257/343; 257/E29.256; 257/347; 438/163
(58) Field of Classification Search .......... 257/343, 257/E29.256, E21.411, 347; 438/300, 163
See application file for complete search history.

(56) References Cited

U.S. PATENT DOCUMENTS

| | | | |
|---|---|---|---|
| 5,376,578 A | 12/1994 | Hsu et al. | |
| 5,587,604 A * | 12/1996 | Machesney et al. | 257/350 |
| 5,693,959 A | 12/1997 | Inoue et al. | |
| 5,767,549 A | 6/1998 | Chen et al. | |
| 6,048,756 A * | 4/2000 | Lee et al. | 438/151 |
| 6,306,691 B1 | 10/2001 | Koh | |
| 6,437,404 B1 | 8/2002 | Xiang et al. | |
| 6,512,269 B1 | 1/2003 | Bryant et al. | |
| 6,624,475 B2 | 9/2003 | Bryant et al. | |
| 6,960,806 B2 | 11/2005 | Bryant et al. | |
| 7,009,265 B2 | 3/2006 | Anderson et al. | |
| 2002/0175374 A1 | 11/2002 | Iwata et al. | |
| 2004/0219724 A1 * | 11/2004 | Park et al. | 438/197 |
| 2005/0045949 A1 | 3/2005 | Lin et al. | |
| 2005/0110079 A1 | 3/2005 | Nowak | |
| 2005/0118826 A1 | 6/2005 | Boyd et al. | |
| 2005/0164433 A1 | 7/2005 | Doris et al. | |
| 2005/0189589 A1 | 9/2005 | Zhu et al. | |
| 2006/0001095 A1 | 1/2006 | Doris et al. | |

OTHER PUBLICATIONS

Plummer, "Silicon VLSI Fundamentals, Practice and Modeling", 2000, Prentice Hall, p. 71.*
Anderson et al., U.S. Appl. No. 11/869,766, BUR920060049US2, Office Action Communication, Jul. 14, 2009, 14 Pages.

* cited by examiner

*Primary Examiner*—Wael Fahmy
*Assistant Examiner*—Tucker Wright
(74) *Attorney, Agent, or Firm*—Gibb I.P. Law Firm, LLC; Anthony Canale

(57) ABSTRACT

A FET has a shallow source/drain region, a deep channel region, a gate stack and a back gate that is surrounded by dielectric. The FET structure also includes halo or pocket implants that extend through the entire depth of the channel region. Because a portion of the halo and well doping of the channel is deeper than the source/drain depth, better threshold voltage and process control is achieved. A back-gated FET structure is also provided having a first dielectric layer in this structure that runs under the shallow source/drain region between the channel region and the back gate. This first dielectric layer extends from under the source/drain regions on either side of the back gate and is in contact with a second dielectric such that the back gate is bounded on each side or isolated by dielectric.

12 Claims, 19 Drawing Sheets

FETS WITH SELF-ALIGNED BODIES AND BACKGATE HOLES

BACKGROUND

1. Field of the Invention

The embodiments of the invention generally relate to transistors, and more particularly, to a silicon on insulator (SOI) field effect transistor (FET) that includes source/drain regions that are shallower than the channel region.

2. Description of the Related Art

Conventional silicon-on-insulator (SOI) field effect transistors (FET) use a relatively thin layer of semiconducting material, e.g., Si, overlaying a layer of insulating material, e.g. a buried oxide or dielectric layer. The relatively thin semiconductor layer is generally the area in which active devices, e.g., FETs, are fabricated. In high-performance SOI logic devices, the logic devices, i.e., FETs, are built within the relatively thin Si region of the SOI substrate to minimize source and drain capacitance.

Fully-depleted SOI FET devices can show large threshold voltage variations. The threshold voltage variations are effected by SOI thickness as well as the channel length variations that are a result of conventional device fabrication techniques.

SOI FETs are often distinguished as partially depleted (PD) when the silicon film is thicker than the maximum gate depletion region thickness, and fully depleted (FD) when the silicon film is thin enough that the entire film is depleted before the threshold voltage condition is reached. Because of current technology scaling trends in reducing the SOI thickness, partially-depleted SOI devices are being pushed closer and closer to the fully-depleted mode.

A well-designed halo implant can create devices such that the total channel doping concentration is higher in short channel devices resulting in a more useful threshold voltage when the drain voltage is high. Therefore, devices can be operated at much shorter channel lengths. This method however is difficult to extend further because the junction leakage current may be too high because of the high halo doping concentration and the doping fluctuation effect could dominate the threshold variations in short-channel length devices.

Improving a parameter such as threshold voltage (Vt) can result in degradation of various other parameters such as resistance (Rseries) or junction capacitance (Cj), for example. Many examples are evident where attempts have been made to minimize the tradeoffs between the various parameters of a high-speed semiconductor device.

For example, U.S. Patent Application Number 2006/0001095 A1, incorporated herein by reference, teaches a method of creating ultrathin body, fully-depleted SOI MOSFETs wherein the SOI thickness changes with gate-length variations; thus, minimizing threshold voltage variations that are typically caused by SOI thickness. The method uses a replacement gate process in which nitrogen is implanted to selectively retard oxidation during formation of a recessed channel. Also, U.S. Patent Application Number 20050110079 A1, incorporated herein by reference, teaches a method of forming a double gate FET.

Further, U.S. Patent Application Number 2005/0189589 A1, incorporated herein by reference, teaches a hybrid bulk/SOI FET where the transistor is formed at a surface of a layer of semiconductor material and comprises a gate structure formed on the surface of the layer of semiconductor material and a discontinuous film of material within the layer of semiconductor material aligned with the gate structure of the transistor.

U.S. Pat. No. 5,376,578 A, incorporated herein by reference, teaches a method of forming a FET in which the source, drain and isolation regions are all raised above the surface of the single crystal silicon which includes the steps of depositing a blanket gate stack including the gate oxide and a set of gate layers and then depositing isolation member apertures etched in the gate stack using the gate oxide as an etch stop.

SUMMARY

In view of the foregoing, an embodiment of the invention provides a FET that has shallow source and drain regions, a deep channel region and a gate stack. The FET structure also includes halo or pocket implants that extend through the entire depth of the channel region. This aspect of the invention is advantageous because a portion of the halo and well doping of the channel is deeper than the source and drain depth and thus achieves better threshold voltage and process control.

Another embodiment of the present invention relates to a semiconductor device that includes a gate stack and source and drain regions that are shallower than the channel region, yet also includes a back gate. The back gate of this embodiment of the invention is positioned below the dielectric layer which resides below the source and drain regions and channel region and above a second dielectric layer. The dielectric layer below the source and drain regions actually extends past the back gate layer and is in contact with the second dielectric layer. These aspects of the invention will be better understood when considered in conjunction with the detailed description and drawings herein.

In another embodiment of the invention, the gate stack of the FET structure is self-aligned such that the edges of the gate stack are substantially coincident with edges of said channel region. Moreover, in structures having a back gate, the back gate is self-aligned such that the vertical edges of the back gate, although not substantially coincident edges with the front gate and channel, are aligned with the vertical edges of the front gate and channel.

Other aspects of the invention relate to a process for fabricating a device having source and drain regions and channel region of varying depths. In one embodiment the process for the formation of the gate stack is self-aligned. In another embodiment the process for the formation of the gate stack is not self-aligned.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
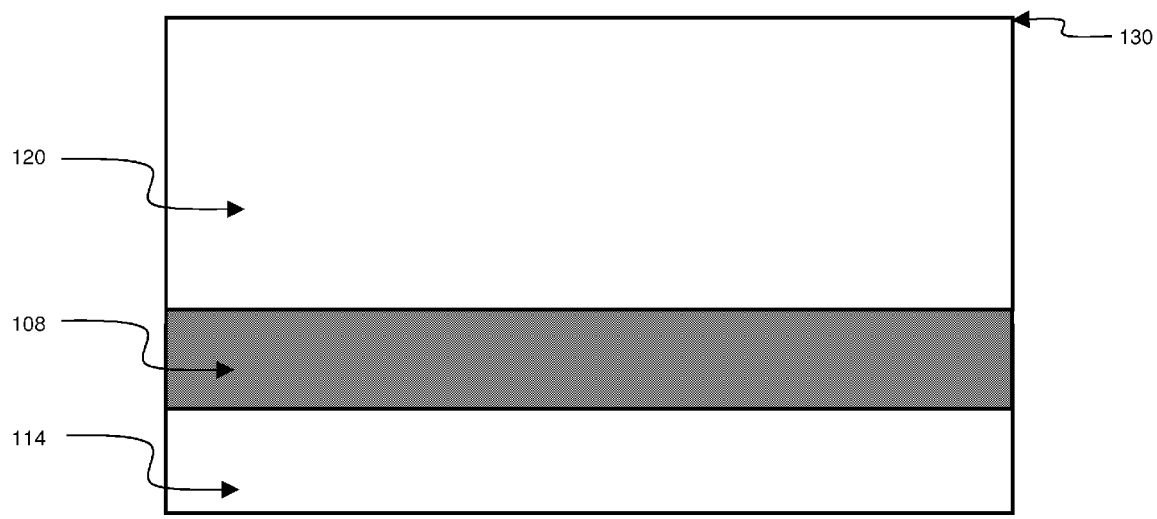
FIG. 1-7 illustrate schematic diagrams for the formation of a FET having shallow source/drain regions and deep channel regions.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a low junction capacitance, highly-scaled SOI with good threshold voltage control. As discussed above, highly-scaled SOI often involve thin, fully-depleted SOI semiconductor devices. Small body volume, i.e. thin devices, are more likely susceptible to large dopant fluctuations, which affect threshold voltage and capacitance of the SOI devices.

One embodiment of the invention satisfies this need by providing a SOI semiconductor device with a deep channel region and shallow depth source and drain regions. The SOI has a thicker than conventionally-scaled Si layer and a thick buried oxide layer. Because the Si layer is thicker than standard, there is more dopant volume available to set the threshold voltage. With a retrograde well implant, if used, the channel can deplete back to dopant peak. Thus, the device can be partially depleted or quasi-fully depleted. This addresses the problems of thin Si layer devices that are fully depleted before the threshold voltage is reached, as discussed.

There is also a need to self-align back gates to source/drain diffusion regions in thin fully-depleted back-gated FETs to minimize front-to-back gate misalignment because this misalignment results in poor electrostatic channel control and excess parasitic capacitance. Front-to-back gate misalignment is one of the biggest problems for planar back-gated FETs.

Another embodiment of the invention satisfies this need by providing a fully-depleted planar back-gated SOI where the back gate exists only below the top gate and is isolated by dielectric layers. The back gate of this aspect of the invention is positioned below the dielectric layer which resides below the source and drain regions and channel region and above a second dielectric layer. The dielectric layer below the source and drain regions actually extend past the back gate layer and is in contact with the second dielectric layer.

Referring now to the drawings, and more particularly to FIGS. 1 through 7, discussed at length below, where similar reference characters denote corresponding features consistently throughout the Figures, there are shown preferred embodiments of the invention (e.g., the buried oxide layer of the SOI wafer).

Figure 7:
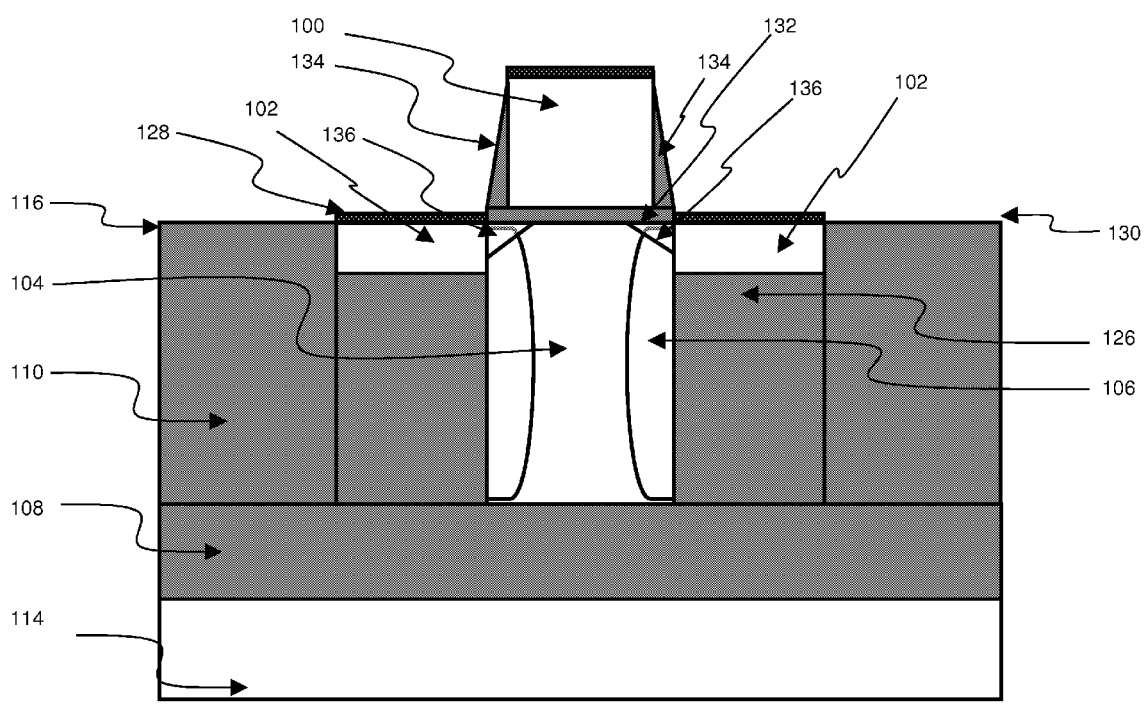

FIG. 7 illustrates a first embodiment of the invention which is a SOI FET which has a gate stack (100), source and drain regions (102) and channel region (104), where the source and drain region and the channel region have different depths. The SOI FET of this embodiment of the invention comprises a substrate having a top surface (130). The substrate of the present invention is defined in the Figures by elements (114), (108), (110) and (126). The substrate can comprise different dielectric materials as insulators (e.g., oxides, etc.). Over the top surface of the substrate is positioned a gate stack or, in other words, gate (100). For convenience, the entire gate stack is referred to, herein, by element (100) in the Figures, and it is understood that the term gate is also used herein, to mean the entire gate stack structure. The gate stack structure comprises the gate (100), a gate oxide (132), and spacers (134). It is understood by those of skill in the art that the terms gate (100) and gate stack which includes the gate oxide layer and spacers and gate can be used interchangeably herein. The invention also comprises a channel region (104) positioned in the substrate below the gate. The FET of the invention also comprises source and drain regions (102) extending from the top surface of the substrate into the substrate. The channel region extends a further distance from the top surface of the substrate into the substrate when compared to said source and drain regions.

The depths of the source and drain region relative to the channel region can be changed to modify or optimize parameters of the FET. Optimization of this structure can be performed using Technology Computer-Aid Design (TCAD) device simulation software. Using TCAD the various tradeoffs between issues such as Vt, capacitance, the lateral coupling between the source and drain and the channel, series resistance, etc., can be evaluated for specific technology targets. Additionally, at least part of the channel region (104) is partially depleted. The structure of the channel region also comprises halo implants (106) or pocket implants on opposite sides of the channel. Various ratios between the thickness of the source and drain regions and the channel are possible. The implants extend a further distance from the top surface of the substrate into said substrate when compared to said source and drain regions. The implants may also extend the same distance from the top surface of the substrate as the channel region. (106).

Because a portion of the halo and well doping of the channel is positioned deeper into the substrate from the surface than the source and drain regions, better threshold voltage and process control is achieved. Additionally, the structure of the FET allows for altering the doping, thus, making the device fully depleted or partially depleted. The greater thickness of the substrate beneath the source and drain regions as compared to the channel region provides for increased source and drain isolation. The shallower source and drain regions relative to the channel region allows for reduced junction capacitance. Additionally, the channel region (104) can be thicker than conventionally-scaled because a SOI wafer having a thick silicon layer may be used to make the FET. Conventionally-scaled SOI technologies, (i.e., the source, drain, and channel are substantially the same thickness) have considered Si channel down to the range of 10 nanometers.

Figure 17:
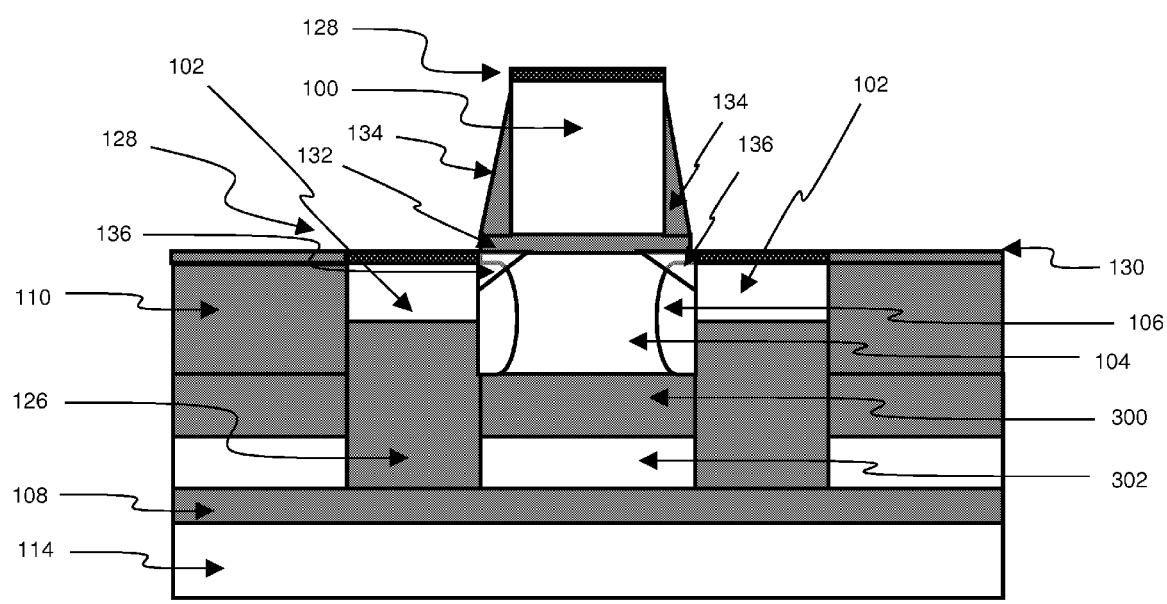

FIG. 17 illustrates a second embodiment of the invention discussed at length below, comprising a gate stack (100), source and drain region (102) and channel region (104), where the source and drain region and the channel region have different depths, and a back gate (302) that is surrounded by the substrate (i.e., everything but the intrinsic FET). The substrate of the present invention is defined in the Figures by elements (114), (108), (110), (126) and (300). In addition to the elements described above, this embodiment of the invention includes a back gate. The structure comprises a back gate (302) positioned below the channel region (104) and positioned a further distance from the top surface (130) into the substrate than the channel region (104). The structure of the back gate is such that the back gate is positioned into the substrate so that the substrate completely surrounds said back gate. Therefore, the back gate is completely isolated by substrate. In addition to the benefits discussed of having shallow source/drain regions and a deep channel region, isolating the back gate with dielectric provides for minimized back gate capacitance.

Figure 2:
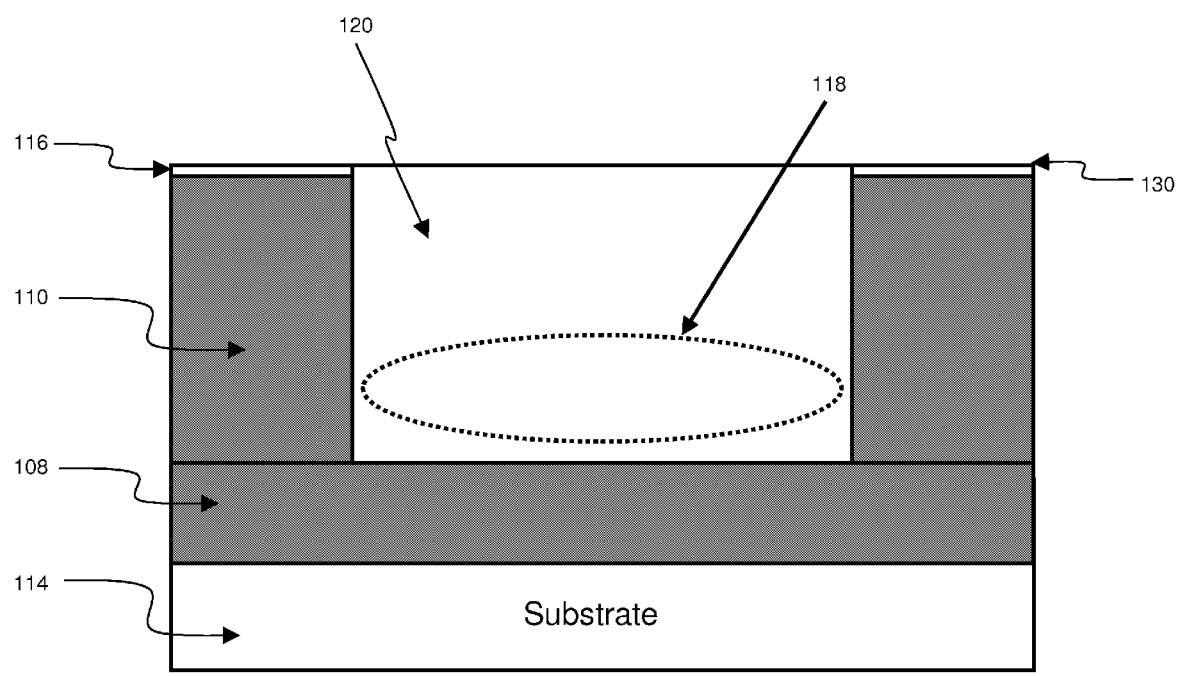
Figure 3:
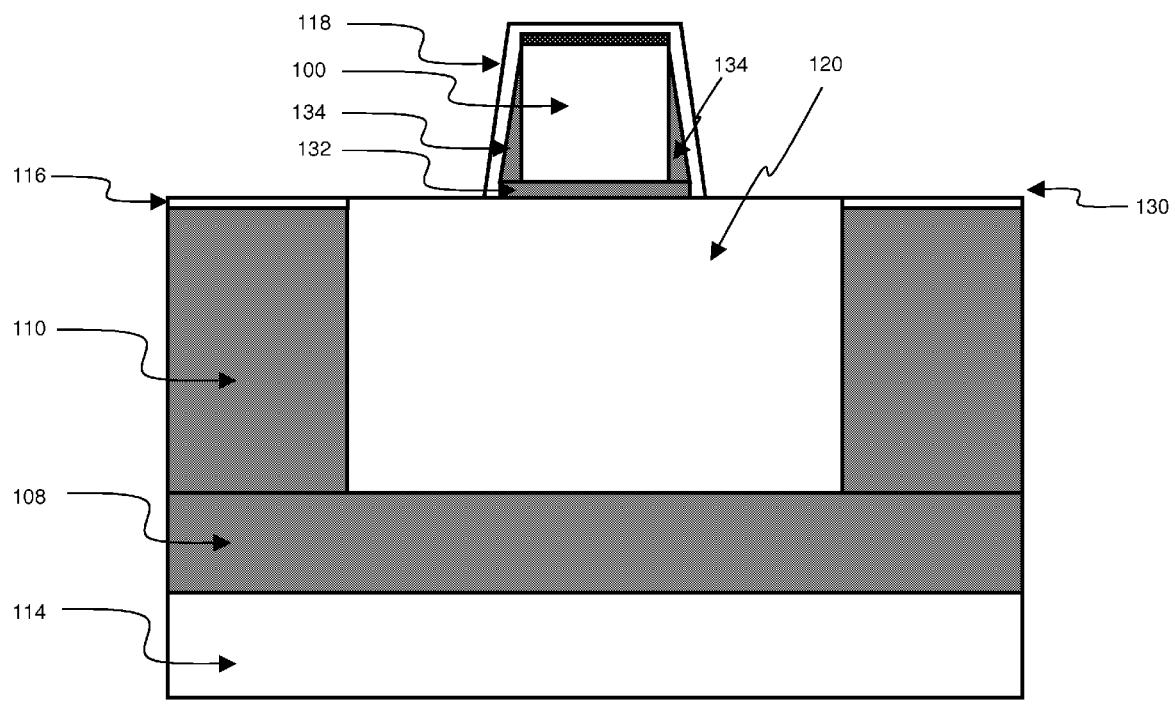
Figure 4:
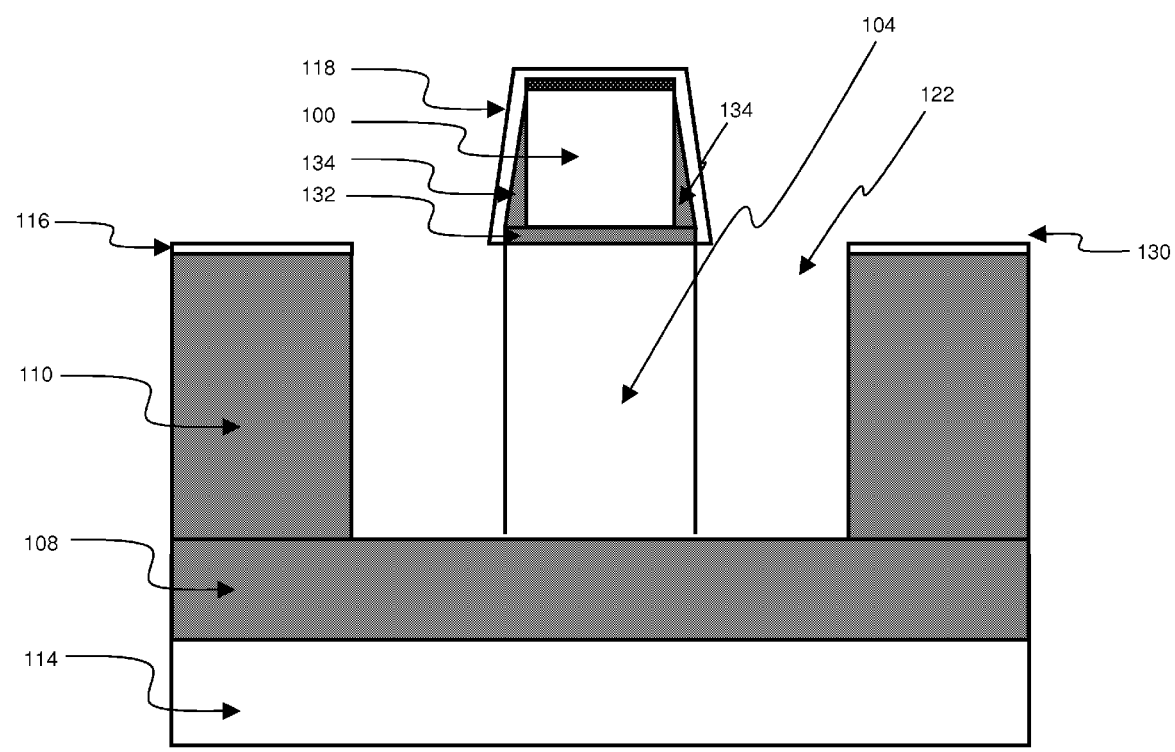
Figure 18:
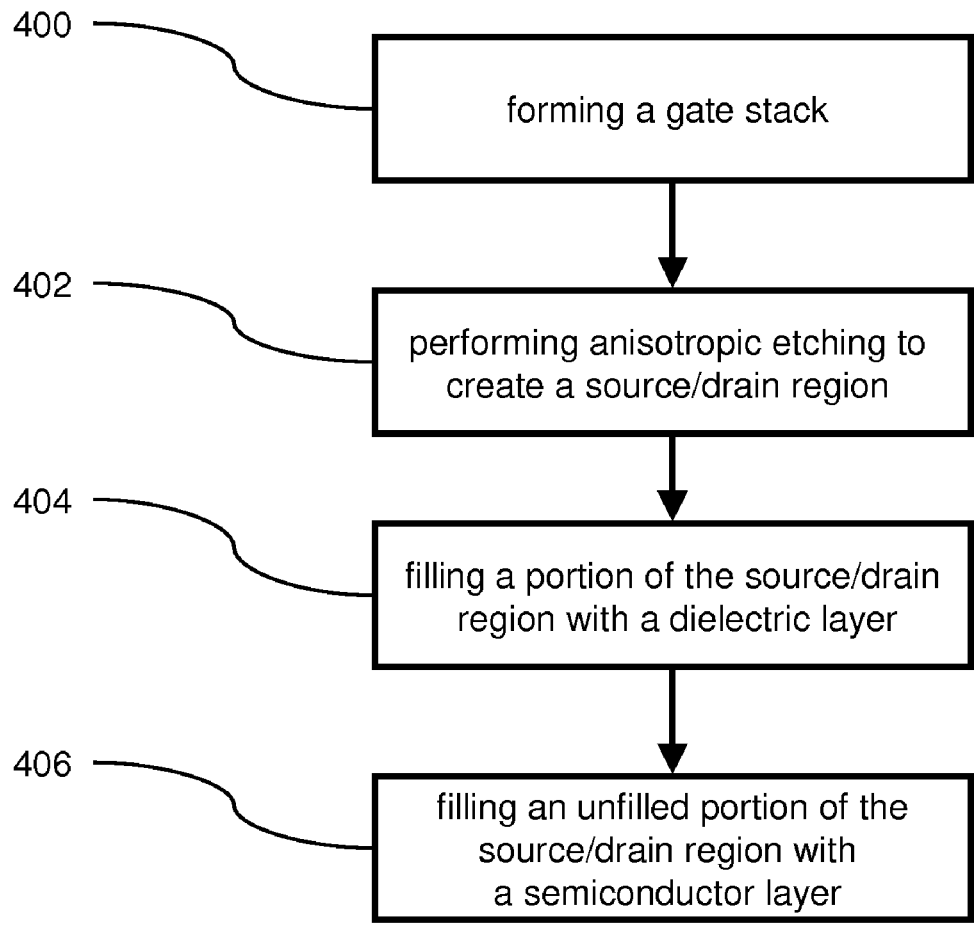
FIG. 18 is a flow diagram illustrating a method of an embodiment of the invention.

FIG. 18 illustrates a flow diagram of the first embodiment (FIGS. 1-7) that is a self-aligned method for planar FET fabrication. In a method for self-aligning a gate stack with the channel region of a FET, a SOI starting wafer (114) with thick silicon layer (120) which can be thicker than that which standard scaling, as discussed above prescribes and a thick buried oxide layer (108) is provided. FIG. 1 shows an SOI wafer. Generally, thin silicon layers in the SOI are the convention to provide for good threshold voltage control. However, the differential depths of the source and drain region and channel of the present method and the structure of the present method provide for such control. FIG. 2, exemplifies the formation of a shallow trench isolation (STI) (110) by conventional methods to isolate the semiconductor region (120). The STI includes a nitride cap (116) to protect the isolation regions from subsequent etching processes. A well ionization/implant (I/I) process may also be optionally performed (118). A gate stack is then formed by conventional methods (400) having a gate dielectric layer, e.g., gate oxide, (132), gate (100), spacers (134) and a sacrificial dielectric layer (e.g., nitride) protective cap (118) to protect the gate. FIG. 3 shows the formation of a gate stack. Reactive ion etching (i.e., aniosotropic etching) digs, in one direction, vertically down either side of the gate stack to form cavities (122) on either side of the channel region to form the source and drain regions (402). A diagram of this step is shown in FIG. 4.

Figure 5:
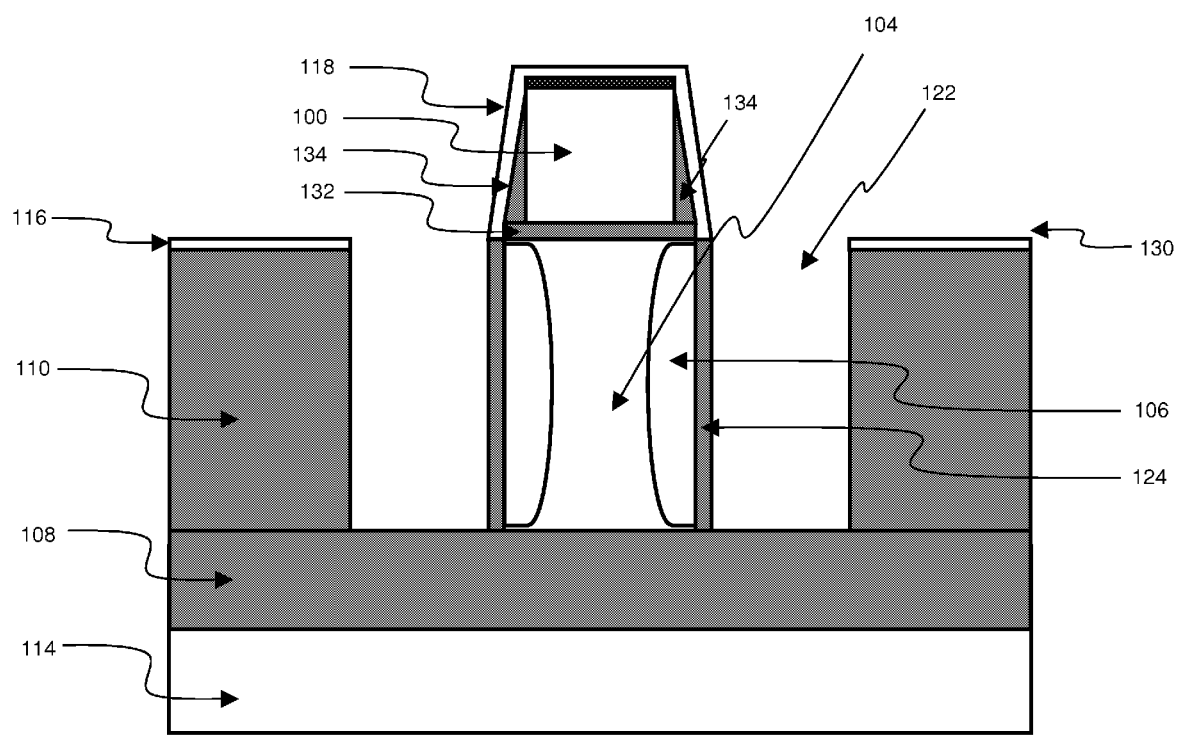
Figure 6:
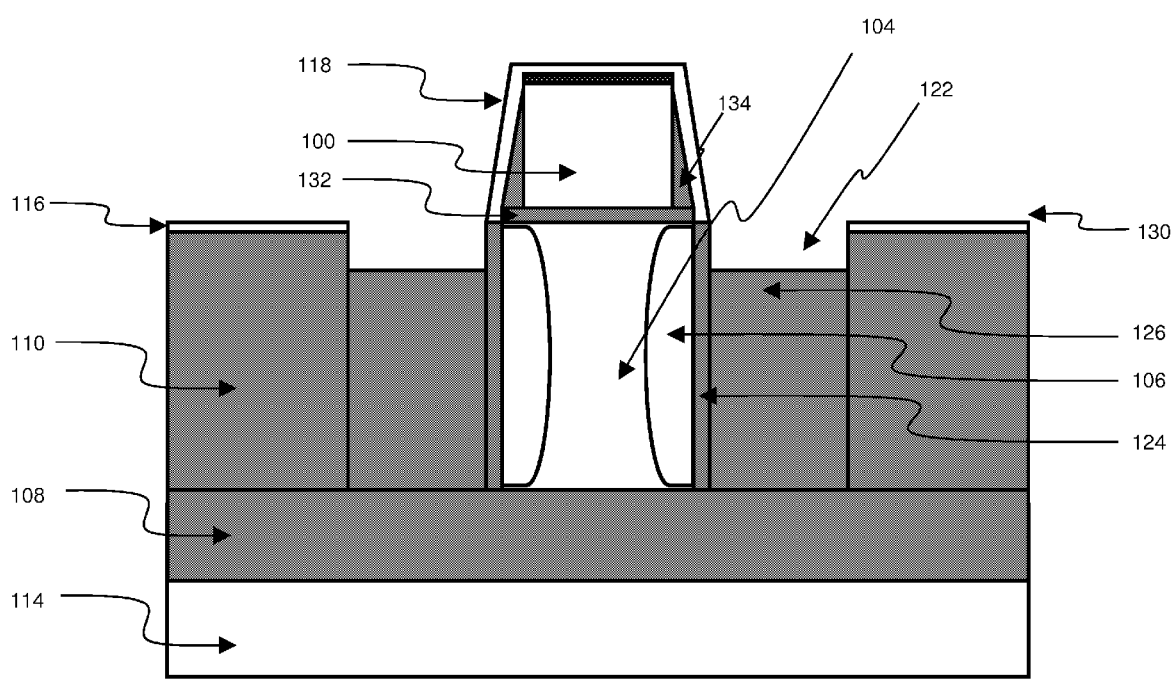

A halo implant or pocket implant (106) is formed as seen in FIG. 5. The halo implant can be of the same dopant as the channel region but of a higher concentration. The halo is used to set the threshold voltage under certain bias conditions. As seen in FIG. 5, a dielectric layer (124), (e.g., oxide, nitride, etc.), is also added along the vertical axis of the halo implant on the source and drain side of the halo implant. The protective dielectric layer is provided to protect the channel from the implant processes. The method then requires filling a portion of the source and drain region with a dielectric insulator to a desired depth (402). FIG. 6 shows the structure after the filling step. This step is performed by overfilling the cavity (122) of the source and drain regions made by the etching step, then depositing the dielectric insulator in the cavity of the source and drain regions. The dielectric, (e.g., oxide), used in this fill step may be the same oxide as the other regions of the substrate (110) or (108) or a different oxide altogether. The dielectric in the cavity of the source and drain regions is planarized and then the insulator is etched back to form a desired source and drain region depth; thus, resulting in a shallower source/drain region than the channel region.

A very precise method for filling the cavity for the source and drain region with dielectric includes hole fill steps and etch back steps to form recesses for source and drain regions to be formed (404). Repeated fill and etch steps that produce very uniform dielectric layers in the cavities of the source and drain regions are performed. First, the source drains are overfilled with dielectric, e.g., HDP oxide (126). Then the new dielectric layer fill is planarized to be flush with the top surface of the gate. Using one or more fill and etch steps (e.g., anisotropic etch steps), the dielectric is etched back to the surface of the source and drain region. After planarization, a portion more of the oxide is etched to form regions where the source and drain regions can be regrown that are shallower than the channel region.

The dielectric layer (124) for use with the halo implants is removed adjacent to the source/drain regions, then the source and drain regions (102) are formed (406). Source and drain region formation methods include lateral epitaxial regrowth where silicon grows out from the small amount of exposed channel pillar. Lateral epitaxial regrowth allows for SiGe growth in p channel FET (PFET). Another method for source drain formation is deposition of polysilicon or a metal. The deposition of polysilicon is performed by a conventional deposition process including, for example, chemical vapor deposition (CVD), plasma-assisted CVD, evaporation or chemical solution deposition. Lightly-doped drains (136) and a silicide layer (128) are added at the end of processing. The FET structure of the present method is exemplified in FIG. 7. Because the gate stack is added at the very beginning of the process, the nitride-capped gate acts as a mask for the etching of the source drain region. Therefore, the gate and the channel directly below are self-aligned so that the channel region has substantially coincident vertical edges with the gate stack.

In another embodiment of the method, the SOI starting wafer (114) includes a back gate layer (302) above the deep buried oxide layer (108) and below a back gate oxide layer (300). The starting wafer has an appropriate silicon thickness for a partially depleted back-gated FET. The back gate is formed via a wafer bond process. The starting SOI structure is described in FIG. 13. In this embodiment, the source and drain region etching step (402) goes through the back gate oxide layer (300) and through the back gate layer (302) down to and stopping at the deep buried oxide layer (108). The dielectric fill steps (404) and the silicon fill steps (406) proceed as discussed above. Thus, in this embodiment of the method, the back gate is isolated on each side by dielectric and the back gate, channel and gate are all self-aligned such that the vertical edges of the back gate, channel and gate are substantially coincident edges, and the edges of the back gate, although not substantially coincident edges, are directly in line with the channel and gate. A fully self-aligned fabrication process (both gates aligned with each other and with the source/drain doping) is therefore required for the highest performance benefits.

Figure 8:
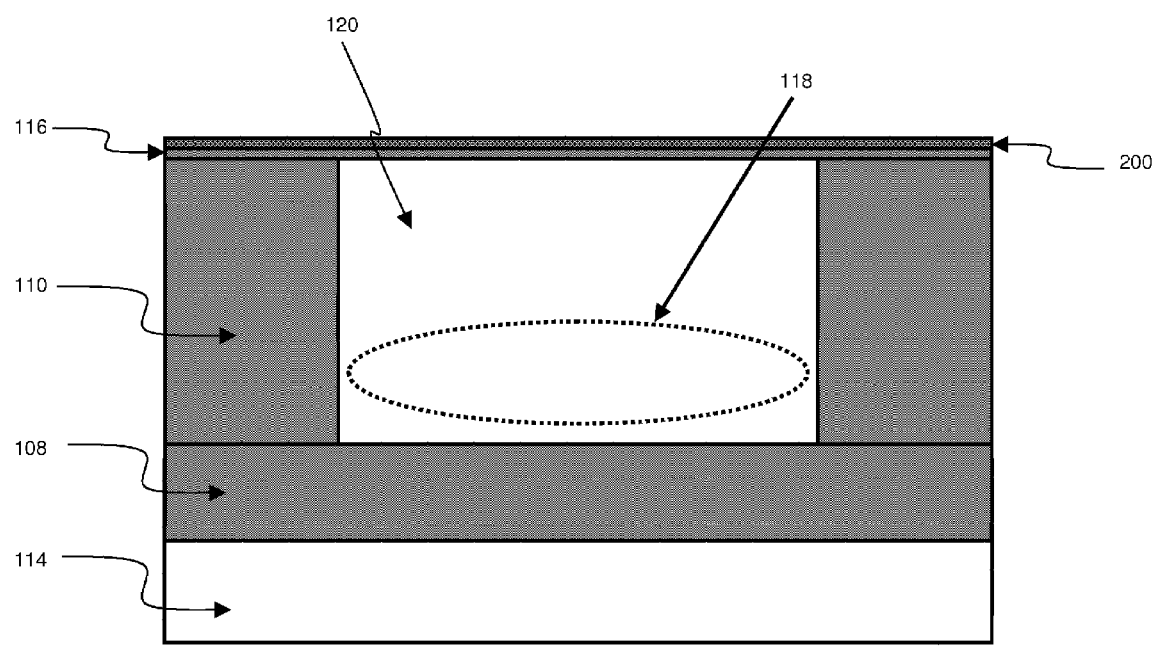
FIG. 8-12 illustrate schematic diagrams for another method of the formation of a FET having shallow source/drain regions and deep channel regions.
Figure 9:
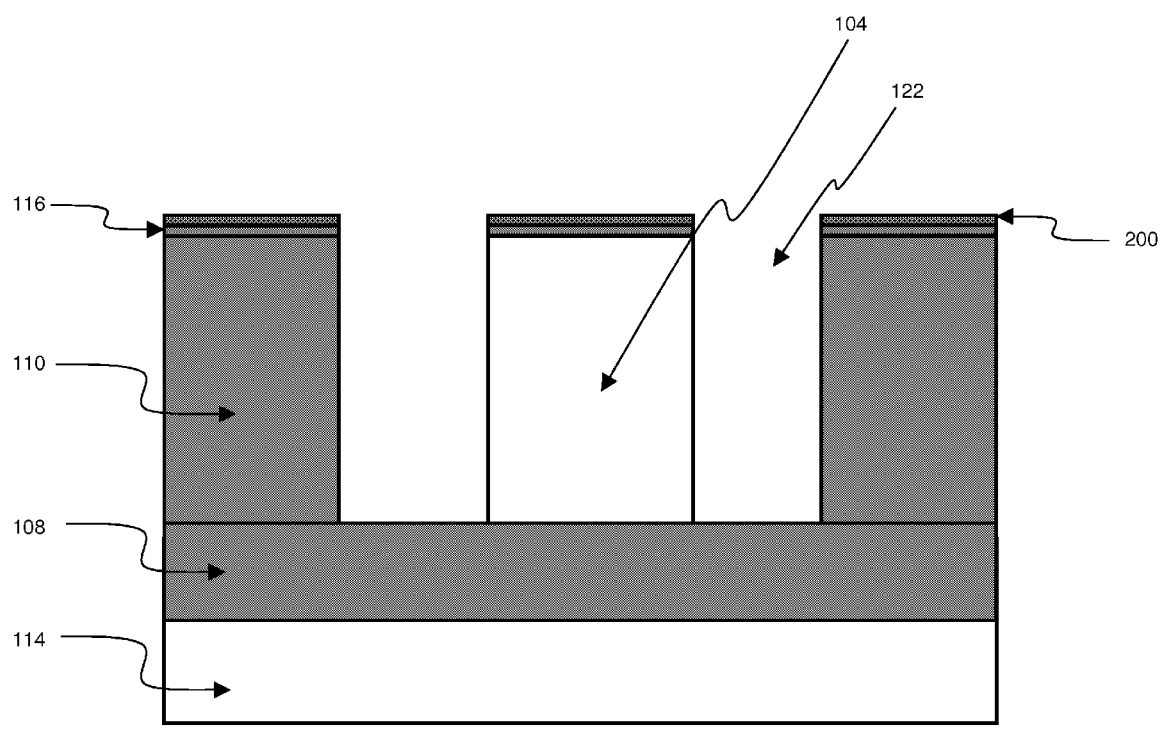
Figure 19:
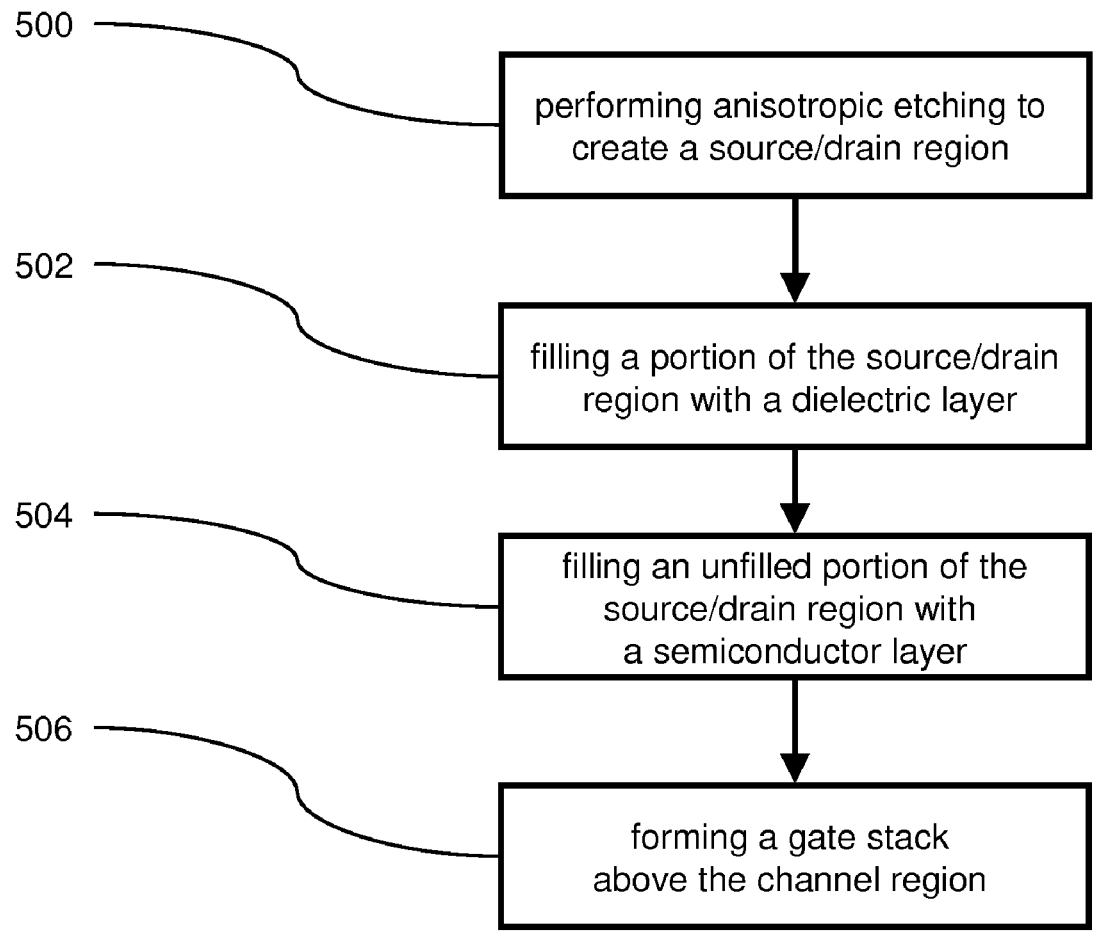
FIG. 19 is a flow diagram illustrating a method of an embodiment of the invention.

FIG. 19 illustrates a flow diagram of the embodiment shown in FIGS. 8-12 that is a non-self aligned method for planar FET fabrication. In this method for making a FET having a shallow source and drain regions (102) and deep channel region (104), a wafer is provided with thick silicon layer (120) which is thicker than that which standard scaling and with a thick buried oxide layer (108). FIG. 1 shows the starting SOI structure. Generally, thin silicon layers in the SOI are the convention to provide for good threshold voltage control. However, the differential depths of the source/drain region and channel of the present method and the structure of the present method provide for such control. FIG. 8, exemplifies the formation of a shallow trench isolation (STI) to isolate the semiconductor region (110), (108). The STI includes an oxide cap (116) and a nitride cap (120) to protect the isolation regions from subsequent etching processes. A well ionization/implant (I/I) process may also be optionally performed (118). An anisotropic etching using a selective etching technique such as RIE is performed (500). The cavities for the source/drain regions are etched back down to but stopping at the deep buried oxide (108). The silicon pillar for the channel region can be wider than the other embodiments described herein to provide a larger area upon which to build the gate and gate stack.

Figure 10:
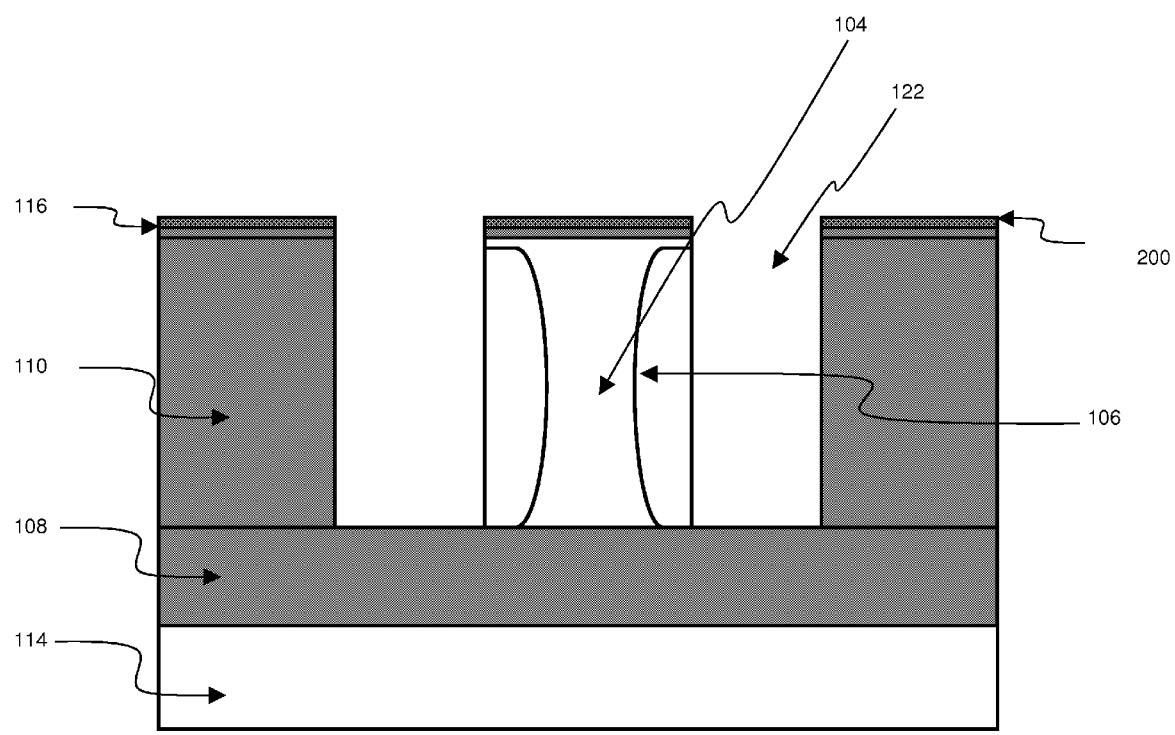
Figure 11:
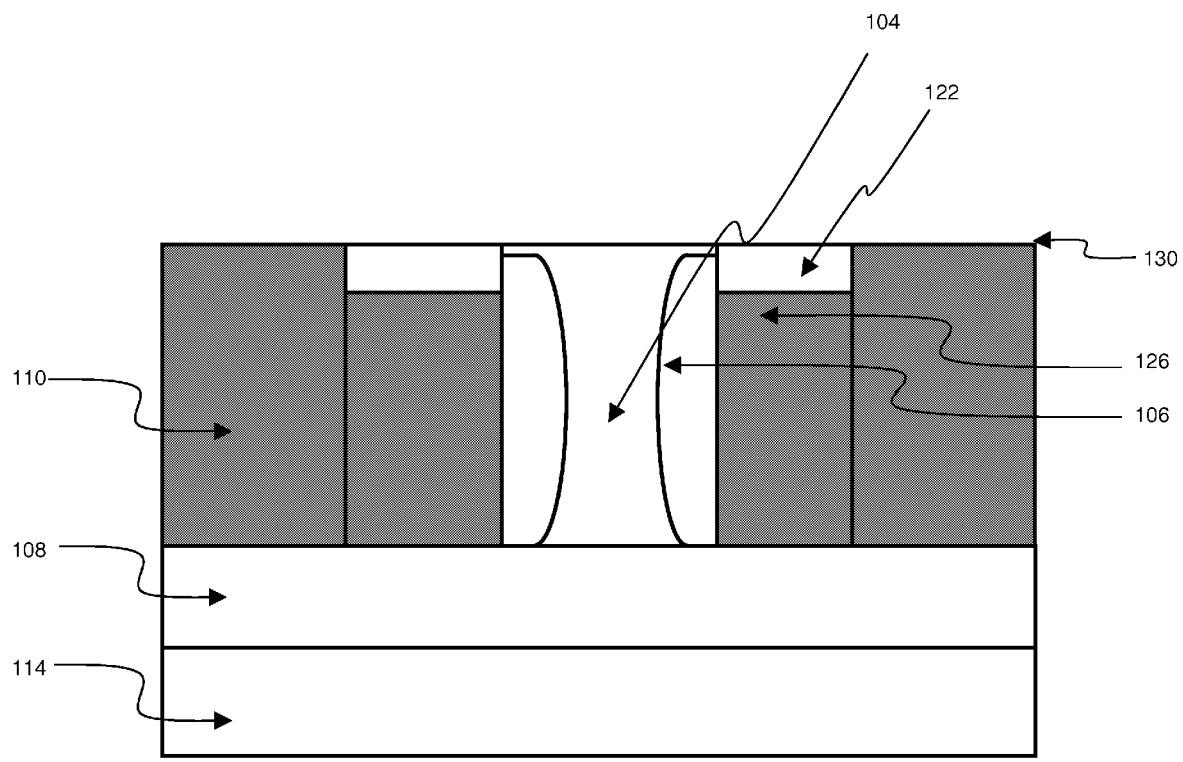
Figure 12:
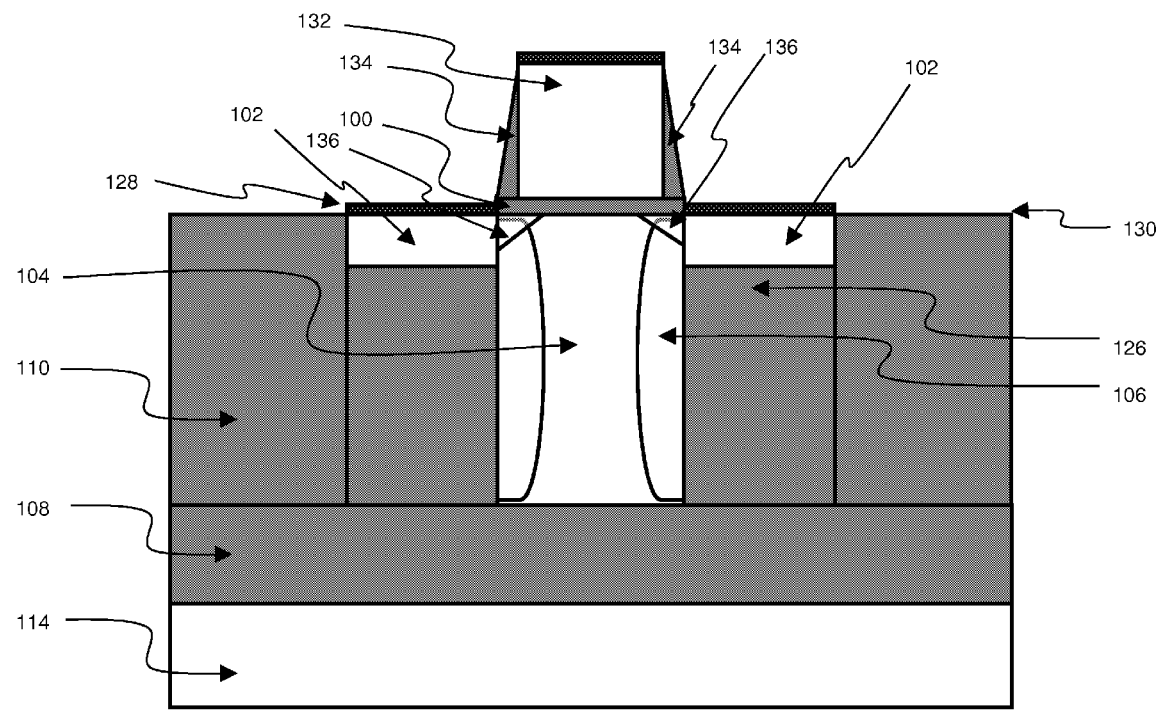

A halo implant or pocket implant (106) is formed FIG. 10. The halo implant shields the channel from electric field lines emanating from the drain diffusion. The halo protects the channel from dopant diffusion from the source and drain regions (102). A dielectric layer (124), (e.g., a nitride), can be also added along the vertical axis of the halo implant on the source/drain side of the halo implant. The dielectric layer is provided to protect the silicon from the implant processes. The method then requires filling a portion of the source/drain region with a dielectric insulator to a desired depth (502). FIG. 11 shows the structure after the filling step. This step is performed by depositing the dielectric insulator in the source/drain region wells then etching the insulator back to a desired source/drain depth which is shallower than the depth of the channel region.

A very precise method for filling the cavities of the source and drain regions with dielectric includes hole fill steps (502) and etch back steps to form recesses or cavities to make source and drain regions. Repeated fill and etch steps produce very uniform dielectric layers in the wells of the source/drain regions. First, the source/drains are overfilled with dielectric, e.g., HDP oxide, (126). Then the new dielectric layer fill is planarized to be flush with the top surface of the gate. Using one or more fill and etch steps, (e.g., anisotropic etch steps), the dielectric is etched back to the surface of the source/drain region. After planarization, a portion of the oxide is etched to form regions where the source/drain region can be regrown that are shallower than the channel region.

The dielectric layer (124) is removed near the surface of the channel, then the source/drain regions (102) are formed by filling the cavity with conductive material (504). Source and drain formation methods include lateral epitaxial regrowth where silicon grows out from the small amount of exposed channel pillar. Lateral epitaxial regrowth allows for SiGe growth in p channel FET (PFET). Another method for source/drain formation is deposition of polysilicon or a metal. The deposition of polysilicon is performed by a conventional deposition process including, for example, chemical vapor deposition (CVD), plasma-assisted CVD, evaporation or chemical solution deposition. A gate stack (100) is then formed (506) by conventional methods with attention to alignment between the gate and source/drain regions. Lightly-doped drains (130) and a silicide layer (128) are added at the end of processing and conventional back end of line (BEOL) processing is performed.

Figure 13:
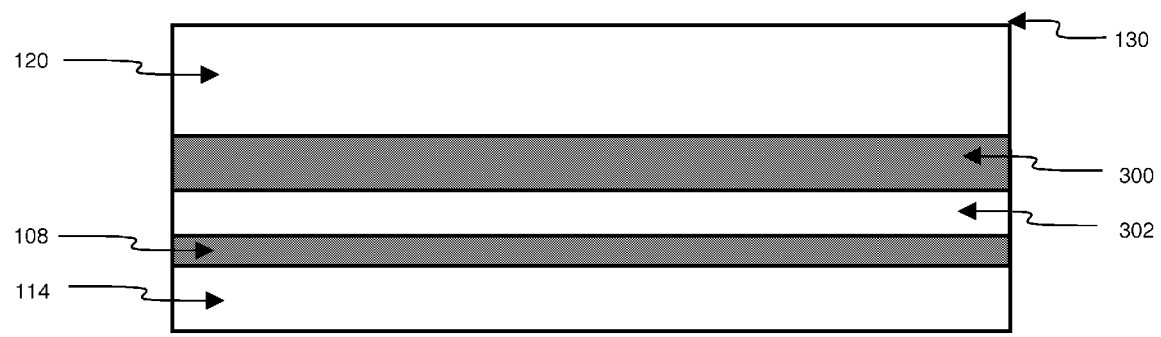
FIG. 13-17 illustrate schematic diagrams of a FET having shallow source/drain regions and deep channel regions and a back gate.
Figure 14:
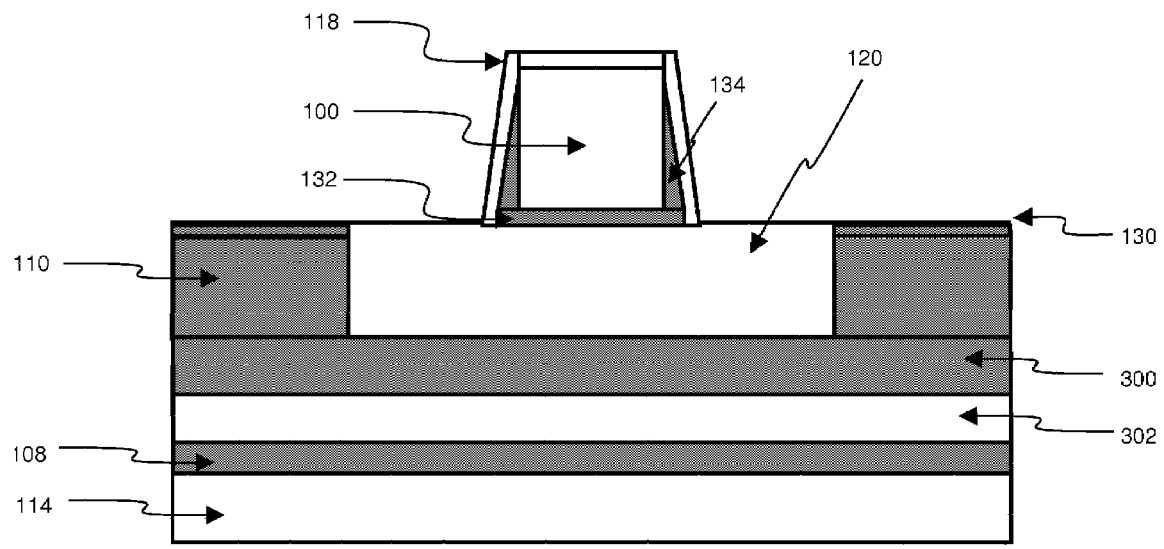
Figure 15:
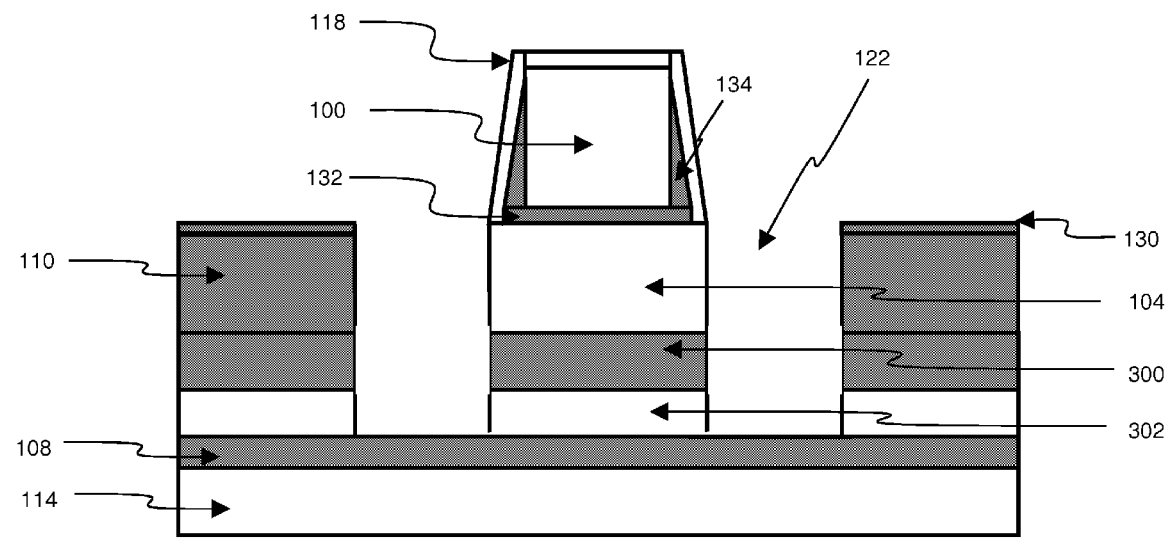
Figure 16:
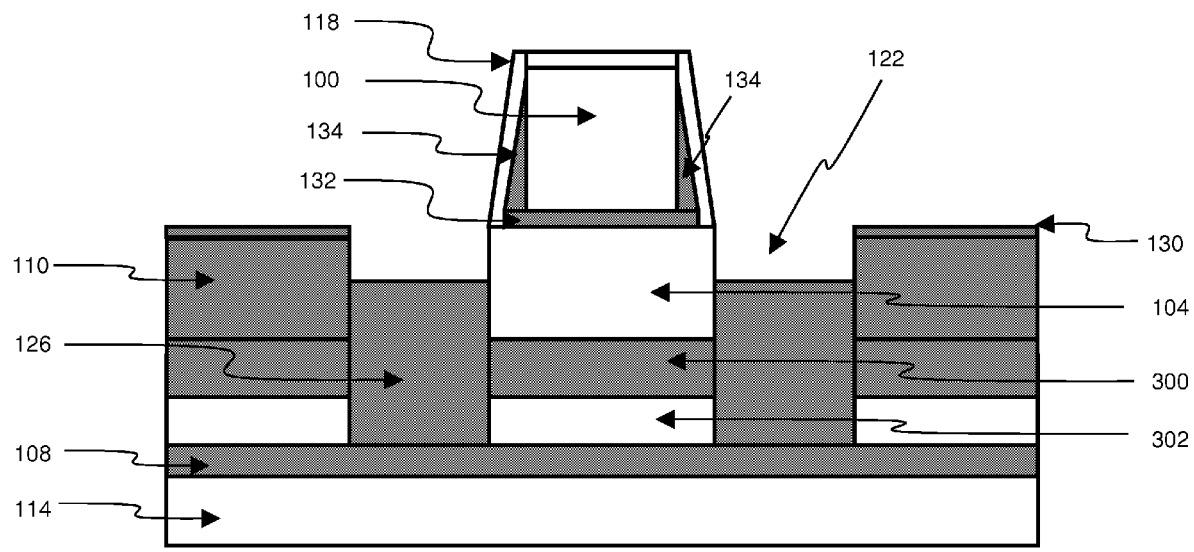

In another embodiment of the method, shown in FIGS. 13-17, the SOI starting wafer includes a back gate layer (302) above the deep buried oxide layer (108) and below a back gate oxide layer (300). FIG. 13 shows the starting structure. The starting wafer has an appropriate silicon thickness for a partially depleted back-gated FET. The back gate layer is formed via wafer bond process. FIG. 14 shows the formation of the gate stack (100) in this embodiment. The source/drain etching step(s) (500) goes through the back gate oxide layer and through the back gate down to and stopping at the deep buried oxide layer as show in FIG. 15. The dielectric fill steps and the silicon fill steps proceed as discussed above, FIGS. 16 and 17. Lightly-doped drains (136) and a silicide layer are added and conventional back end of line (BEOL) processing is performed.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A silicon on insulator (SOI) field effect transistor (FET) comprising:
    an insulator layer;
    a semiconductor layer on said insulator layer, said semiconductor layer having a top surface and vertical sidewalls;
    a gate over said top surface;
    a channel region in said semiconductor layer below said gate;
    first isolation regions on said insulator layer and positioned laterally adjacent to lower portions of said vertical sidewalls;
    source and drain regions above said first isolation regions and positioned laterally adjacent to upper portions of said vertical sidewalls; and
    a dielectric layer extending vertically between said lower portions of said vertical sidewalls and said first isolation regions.

2. The structure of claim 1, wherein a part of said channel region is partially depleted.

3. The structure of claim 1, wherein said channel region is fully depleted.

4. The structure of claim 1, said first isolation regions and said dielectric layer comprising different materials.

5. The structure of claim 1, further comprising second isolation regions on said insulator layer and positioned laterally adjacent to said first isolation regions and said source and drain regions opposite said vertical sidewalls.

6. The structure of claim 1, further comprising doped regions in said semiconductor layer at said upper portions of said vertical sidewalls adjacent to said source and drain regions.

7. A silicon on insulator (SOI) field effect transistor (FET) comprising:
    an insulator layer;
    a semiconductor layer on said insulator layer, said semiconductor layer having a top surface and vertical sidewalls;
    a gate over said top surface;
    a channel region in said semiconductor layer below said gate;
    first isolation regions on said insulator layer and positioned laterally adjacent to lower portions of said vertical sidewalls
    source and drain regions above said first isolation regions and positioned laterally adjacent to upper portions of said vertical sidewalls; and
    halo implant regions in said semiconductor layer on opposite sides of said channel region at said vertical sidewalls such that said halo implant regions are positioned laterally adjacent to both said first isolation regions and said source and drain regions; and a dielectric layer extending vertically between said lower portions of said vertical sidewalls and said first isolation regions.

8. The structure of claim 7, said first isolation regions and said dielectric layer comprising different materials.

9. The structure of claim 7, wherein a part of said channel region is partially depleted.

10. The structure of claim 7, wherein said channel region is fully depleted.

11. The structure of claim 7, further comprising second isolation regions on said insulator layer and positioned laterally adjacent to said first isolation regions and said source and drain regions opposite said vertical sidewalls.

12. The structure of claim 7, further comprising doped regions in said semiconductor layer at said upper portions of said vertical sidewalls adjacent to said source and drain regions.

* * * * *